United States Patent
Tam et al.

(10) Patent No.: US 12,289,130 B2
(45) Date of Patent: Apr. 29, 2025

(54) FULL-DUPLEX CONTACTLESS CONNECTORS

(71) Applicant: NXP USA, Inc., Austin, TX (US)

(72) Inventors: Sai-Wang Tam, Sunnyvale, CA (US); Aristotele Hadjichristos, San Diego, CA (US); Steven Daniel, Gilbert, AZ (US); Krishnan Tiruchi Natarajan, Cupertino, CA (US); John Quigley, Saint Thomas, VI (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/083,937

(22) Filed: Dec. 19, 2022

(65) Prior Publication Data

US 2024/0204819 A1 Jun. 20, 2024

(51) Int. Cl.
| | |
|---|---|
| H04B 1/38 | (2015.01) |
| H03H 7/38 | (2006.01) |
| H03K 5/01 | (2006.01) |
| H03K 17/687 | (2006.01) |
| H04B 1/40 | (2015.01) |
| H04L 5/16 | (2006.01) |
| H03K 5/00 | (2006.01) |

(52) U.S. Cl.
CPC .............. *H04B 1/40* (2013.01); *H03H 7/38* (2013.01); *H03K 5/01* (2013.01); *H03K 17/6874* (2013.01); *H03K 2005/00019* (2013.01)

(58) Field of Classification Search
CPC ........ H04B 1/40; H04B 10/61; H04B 1/0458; H04B 1/52; H04B 1/525; H04B 1/7163; H03K 5/01; H03K 17/6874; H03K 2005/00019; H03H 7/38; H03F 3/245; H03G 3/34; H04L 5/143; H03L 7/0818
USPC .......................... 375/346, 349, 350, 219, 220
See application file for complete search history.

(56) References Cited

U.S. PATENT DOCUMENTS

| | | | |
|---|---|---|---|
| 8,564,345 B2 * | 10/2013 | Yu | ........................ H03L 7/0818 327/158 |
| 8,817,891 B2 | 8/2014 | Tam et al. | |

(Continued)

OTHER PUBLICATIONS

Kim, Yanghyo et al. "A Millimeter-Wave CMOS Transceiver With Digitally Pre-Distorted PAM-4 Modulation for Contactless Communications", IEEE Journal of Solid-State Circuits, vol. 54, No. 6, Jun. 2019, pp. 1600-1612.

(Continued)

*Primary Examiner* — Phuong Phu

(57) ABSTRACT

Provided is a contactless connector that includes an antenna system and a wireless transceiver coupled to the antenna system and configured to simultaneously transmit a transmission signal and receive a received signal through the antenna system. The wireless transceiver includes a transformer, a wide-band phase shifter and a combiner. The transformer has a primary coil with a center tap to which the transmission signal is coupled and a first end that is coupled to the antenna system. The transmission signal also is coupled to an input of the wide-band phase shifter. The transformer also has a secondary coil, an output of the secondary coil is coupled to a first input of the combiner, an output of the wide-band phase shifter is coupled to a second input of a combiner, and an output of the combiner provides a self-interference-canceled version of the received signal.

17 Claims, 4 Drawing Sheets

(56) References Cited

U.S. PATENT DOCUMENTS

| | | | | |
|---|---|---|---|---|
| 8,837,956 | B1* | 9/2014 | Zanoni | H04B 10/61 |
| | | | | 398/208 |
| 8,971,421 | B2 | 3/2015 | Tam et al. | |
| 10,680,673 | B2* | 6/2020 | Shekhar | H04B 1/525 |
| 2006/0159158 | A1* | 7/2006 | Moore | H04B 1/7163 |
| | | | | 375/130 |
| 2014/0146718 | A1* | 5/2014 | Mikhemar | H04B 1/52 |
| | | | | 370/278 |
| 2015/0156003 | A1* | 6/2015 | Khandani | H04L 5/143 |
| | | | | 370/278 |
| 2015/0349838 | A1* | 12/2015 | Petrovic | H03G 3/34 |
| | | | | 375/221 |
| 2016/0127111 | A1* | 5/2016 | Chang | H04B 1/0458 |
| | | | | 370/277 |
| 2022/0166597 | A1* | 5/2022 | Hsiao | H03F 3/245 |

OTHER PUBLICATIONS

Kim, Yanghyo et al. "A 125GHz Transceiver in 65nm CMOS Assembled with FR4 PCB Antenna for Contactless Wave-Connectors", (2017), 4 pgs.

Kim, Yanghyo et al. "Millimeter-Wave Contactless Connectors", IEEE Microwave magazine, Apr. 2022, pp. 55-70.

Larocca, T. LaRocco et al. "Millimeter-wave CMOS digital controlled artificial dielectric differential mode transmission lines for reconfigurable ICs," 2008 IEEE MTT-S International Microwave Symposium Digest, 2008, pp. 181-184.

Bautista, A. et al. "Accurate Parametric Electrical Model for Slow-Wave CPW and Application to Circuits Design," in IEEE Transactions on Microwave Theory and Techniques, vol. 63, No. 12, Dec. 2015, pp. 4225-4235.

Molex, "High Speed Device-to-Device Contactless Connectivity", https://experience.molex.com/electronic-solutions/high-speed-device-to-device-contactless-connectivity/, downloaded Nov. 19, 2022, 2 pgs.

ST, "60 GHz RF transceiver for short-range contactless connectivity", Data Brief, ST60A2G0, DB3860—Rev 5—Apr. 2021, 10 pgs.

ST, "60 GHz V-band contactless connectivity transceiver with integrated antenna and tunneling eUSB2, UART, GPIO or I2C", Data Brief, ST60A3G1, DB4668—Rev 1—Feb. 2022, 3 pgs.

Tam, Sai-Wang (Rocco); "RF-Interconnect for Future Network-On-Chip"; UCLA—Department of Electrical Engineering, Ph.D. Final Defense; 2009; 52 pages.

\* cited by examiner

FULL-DUPLEX CONTACTLESS CONNECTORS

FIELD OF THE INVENTION

The present invention pertains, among other things, to systems, apparatuses, methods and techniques for providing contactless connections for transferring or communicating signals between electronic devices.

BACKGROUND

The following discussion concerns certain background information related to the present invention. However, it should be understood that only knowledge clearly, explicitly and specifically described herein as being "conventional" or "prior art" is intended to be characterized as such. Everything else should be understood as knowledge and/or insight originating from the present inventors.

It often is desirable to provide electronic devices with one or more "connectors" in order to allow other devices to communicate with them. Most commonly, such connectors have involved a physical port with multiple electrical contacts, e.g., so that one end of a cable can be plugged into the port of one device on the other end plugged into the port of another device, thereby connecting them and allowing them to communicate with each other. The various Universal Serial Bus (USB) standards/protocols probably are the most common in this regard. In any event, each such physical connector typically includes multiple electrically conductive contacts that physically abut corresponding contacts of another connector (e.g., at one end of a connecting cable) when the two connectors are mated with each other.

Unfortunately, such physical connections often degrade over time, e.g., due to unintentional forces or impacts on the connection, vibration, corrosion, deformation, wear, thermal effects, etc. Therefore, significant effort has been expended in trying to provide contactless (or wireless) connections which, while permitting data transfers, are not subject to such mechanical problems. Unfortunately, the design of a contactless connector has its own challenges, particularly with regard to self-interference when the specifications call for two-way high-speed communications. The result has been that conventional solutions often provide limited data-transfer speeds and/or bandwidth density (provided bandwidth divided by the size of the contactless connector). Accordingly, improvements in such contactless connectors remain desirable.

SUMMARY OF THE INVENTION

The present invention addresses the foregoing need, e.g., in the following ways.

One embodiment of the invention is directed to contactless connector system having a contactless connector that includes an antenna system; and a wireless transceiver coupled to the antenna system and configured to simultaneously transmit a transmission signal and receive a received signal through the antenna system. The wireless transceiver includes a transformer, a wide-band phase shifter and a combiner. The transformer has a primary coil with a center tap to which the transmission signal is coupled and a first end that is coupled to the antenna system. The transmission signal also is coupled to an input of the wide-band phase shifter. The transformer also has a secondary coil, an output of the secondary coil is coupled to a first input of the combiner, an output of the wide-band phase shifter is coupled to a second input of a combiner, and an output of the combiner provides a self-interference-canceled version of the received signal.

Another embodiment is directed to method of implementing a contactless connection, in which, simultaneously, a transmission signal is transmitted and a received signal is received through an antenna system, at combined data rates of at least 2 gigabits per second (Gbs) and over a distance of not more than 50 millimeters (mm). Artifacts of the transmission signal are removed from a composite signal, using a self-interference-rejection/cancellation process that includes a first stage and a second stage, in order to obtain the received signal. The first stage uses a transformer to provide a first amount of self-interference rejection, and the second stage uses a wide-band phase shifter to provide a second amount of self-interference cancellation.

Certain more-specific implementations of either of the foregoing embodiment(s) include one or any combination of the following features.

The wide-band phase shifter comprises a wide-band variable-delay line that introduces a time delay specified by a first control signal.

The wide-band variable-delay line comprises an artificial transmission line that includes a plurality of distributed shunt capacitive elements, with an electronic switch in line with each of said capacitive elements, such that the first control signal specifies which of said capacitive elements are turned on and which are turned off to change the effective dielectric constant of the transmission line and subsequently the propagation speed of the signal.

The wide-band variable-delay line includes a plurality of variable-delay segments connected in series, as well as a plurality electronic switches that are configured to control, under control of the first control signal, which of such variable-delay segments are utilized by the wide-band variable-delay line at a given time.

The wide-band phase shifter also comprises a variable gain element having a gain that is specified by a second control signal.

The first control signal and the second control signal are set using a calibration process.

The combiner is configured as a low-noise amplifier.

The combiner includes a first pair of field-effect transistors (FETs) and a second pair of FETs, the first input of the combiner is coupled to gates of the first pair of FETs, and the second input of the combiner is coupled to gates of the second pair of FETs.

The combiner also includes a second transformer, and the first and second pairs of FETs are connected so as to draw electrical current through a primary coil of the second transformer.

The first pair of FETs has a transconductance that is matched to an impedance of the transformer, and the second pair of FETs has a transconductance that is matched to an impedance of the wide-band phase shifter.

The transformer is a hybrid transformer.

The primary coil also has a second end that is coupled to ground through a matching impedance.

The output of the combiner is coupled to a mixer for frequency-shifting the self-interference-canceled version of the received signal and a demodulator for generating received data.

The wide-band phase shifter comprises a wide-band variable-delay line.

The antenna system and wireless transceiver are configured for radio-frequency wireless communications in a millimeter-wave band at combined data rates of at least 1 gigabits per second (Gbs) and over a distance of not more than 50 millimeters (mm).

The composite signal (e.g., including the transmission signal and receive signal) is input into (or coupled to) a center tap of the transformer.

The wide-band variable-delay line comprises an artificial transmission line that includes a plurality of shunt capacitive elements that are turned on and off to control an amount of delay.

Also included is a calibration process to identify an amount of delay to be provided by the wide-band variable-delay line and an amplitude of a signal output by the wide-band phase shifter.

The calibration process includes scanning across a range of potential delays to find a delay corresponding to a minimum output signal strength and scanning across a range of potential gains to find a gain corresponding to a minimum output signal strength.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED EMBODIMENT(S)

For ease of reference, the present disclosure is divided into sections. The general subject matter of each section is indicated by that section's heading. However, such headings are included simply for the purpose of facilitating readability and are not intended to limit the scope of the invention in any manner whatsoever.

A wireless interface (Wi-INT) according to the present invention preferably provides high data-rate communications (e.g., up to a minimum of 10, 20, 40 or even 80 gigabits per second (Gbs) via radio frequency (RF) over a very short range, e.g., 3-15 millimeters (mm), at low power, e.g., not more than 100 microwatts ($\mu$W) at 1 megabit per second (Mbps), 40 milliwatts (mW) at 530 Mbps, or 300 mW at 10 Gbps. Use of such low power levels is not only beneficial for its own sake (particularly with respect to battery-powered devices), but also enhances security, making it extremely difficult for other devices to eavesdrop on such communications.

Although the foregoing specifications are preferred, increased range (e.g., up to 50 mm) preferably is achievable by increasing transmission power. In addition, a contactless connector according to the present invention preferably is less complex than conventional designs, is small (e.g., not more than 5 mm by 5 mm and 400 micron ($\mu$m) in height), can tolerate lateral misalignment of up to +2 mm and angular misalignment of up to #180°, accommodates any type of modulation, has low latency (e.g., not more than 50 nanoseconds (ns)) and a low bit-error rate (e.g., not more than 10-12), and accommodates bidirectional communications of at least 10 Gbs in each direction.

Generally speaking, the preferred embodiments of the present invention provide on-chip, millimeter-wave (mm-wave) or near mm-wave, full-duplex, contactless connectors that utilizes a hybrid transformer and a novel self-interference cancellation approach. As a result of the present configurations, in-band aggressor tones within such a contactless connector often can be effectively cancelled, thereby significantly boosting bandwidth density. The architectures and techniques of the present invention typically can enable high-bandwidth concurrent bidirectional mm-wave contactless connectors while employing just a single antenna per connector and providing insensitivity to communication channel environment variation, such as misalignment, mechanical vibration/deformation and temperature.

Figure 1:
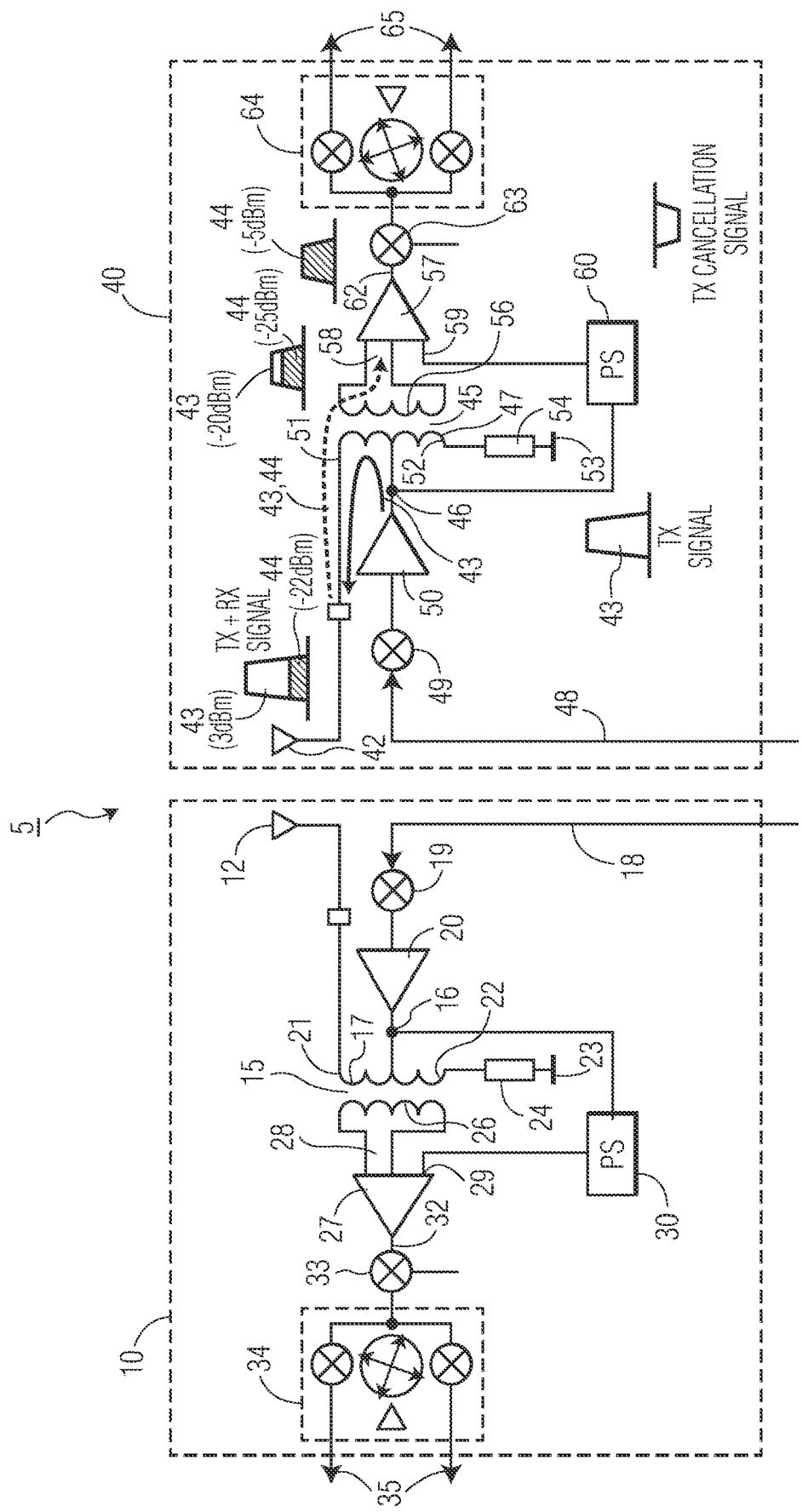
FIG. 1 is a high-level block diagram of a contactless connector pair, together with illustrations of the transmission and received signal levels at various points within one of such connectors, in accordance with a representative embodiment of the present invention.

One example of a contactless connector pair 5 having the foregoing properties is illustrated in FIG. 1, in which two identical connectors 10 and 40 are in sufficiently close proximity to each other (e.g., not more than 10-20 mm apart) so as to be able to communicate with each other. In order to facilitate the following discussion of crosstalk cancellation within each of the connectors 10 and 40, the depiction of connector 40 in FIG. 1 also is annotated with images representing the transmission and received signals at various points.

Because connectors 10 and 40 are identical, the discussion below often refers to them, or their individual components, together, with their corresponding reference numbers just separated by a comma. In other instances, particularly where the following discussion is describing details regarding the signal processing, only connector 40 and its components are explicitly referenced; however, it should be understood that the same comments on considerations also apply to connector 10 and its corresponding components (with each component of connector 10 numbered N-30, where N is the reference number of the corresponding component within connector 40).

As shown, each of connectors 10, 40 includes just a single antenna 12, 42, e.g., in order to maximize bandwidth density. However, in alternate embodiments, a separate transmit and receive antenna, or another antenna system that employs more than a single antenna, are used in either or both of connectors 10, 40. Generally speaking, a contactless connector according to the present invention can use any of a variety of different kinds of antenna systems, i.e., any of a variety of different kinds of single antennas or combinations of antennas. Accordingly, references herein to single antenna 12, 42 can be replaced with the more-general term antenna system, and that more-general term is particularly applicable in such alternate embodiments. In the current embodiment, despite employing just a single antenna 12, 42, connector pair 5 is capable of full-duplex communications, i.e., with each of connectors 10, 40 simultaneously transmitting and receiving RF signals (e.g., at the data rates noted above). Other than antenna 12, 42, the remainder of connector 10, 40 sometimes is referred to herein as the contactless connector's wireless transceiver.

One of the principal design concerns in connection with full-duplex communications is the need to address the problem of self-interference, i.e., the propensity of a device's transmission signal 43 to feed back into its own receiving circuitry, thereby interfering with the received signal 44. This issue can be particularly problematic because the transmission signal 43 typically is much stronger (e.g., 25 decibels (dB) higher because of the 25 dB channel loss between antennas 12 and 42) than the received signal 44. As shown, a typical power level for the composite signal (i.e., the combination of transmission signal 43 and received signal 44) at the antenna 42 is 3 decibel milliwatts (dBm), with just −22 dBm of that amount being from the received signal 44, i.e., from the receiver's perspective, a signal-to-noise ratio (SNR) of −25 db. A contactless connector 10, 40 according to the preferred embodiments of the present invention addresses this problem using a two-stage cancellation structure, e.g., as follows.

The first stage preferably employs a mm-wave hybrid transformer 15, 45, in which the signal 43 to be transmitted is supplied to the center tap 46 of the input coil 47 of hybrid transformer 45. That transmission signal 43, in turn, is generated based on input data 48 (typically in digital form) that has been modulated into the desired RF band (preferably, mm-wave) by modulator 49. As noted above, a contactless connector 10, 40 according to the preferred embodiments of the present invention can accommodate any modulation technique, so modulator 49 can employ, e.g., amplitude-shift keying (ASK), binary phase shift keying (BPSK) or quadrature phase shift keying (QPSK). In any event, the resulting modulated signal preferably is coupled to the center tap 46 of the input coil 47 of the hybrid transformer 45 through power amplifier 50 (in order to provide the final transmission signal 43), which boosts the modulated signal's strength to a level sufficient for transmission (e.g., one of the power levels noted above, depending upon the data transmission rate).

As shown in FIG. 1, one end 51 of input coil 47 of hybrid transformer 45 is coupled to the antenna 42, thereby providing a path for transmission signal 43 from the output of power amplifier 50 to the antenna 42, while its other end 52 is coupled to ground 53 through a dummy load 54 (e.g., matched to the impedance of antenna 42). Meanwhile, the output coil 56 of hybrid transformer 45 is coupled to one set of inputs of receiver amplifier/combiner 57 (preferably, a low-noise amplifier). As a result of this configuration, the received signal 44 is attenuated somewhat (e.g., reduced from approximately −22 dBm to approximately −25 dBm) due to losses in the transformer 45, but the transmission signal 43 is reduced even more (e.g., from approximately 3 dBm to approximately −20 dBm), due to the common mode (TX) to differential mode (RX) rejection within the output coil 56 from the 180° out-of-phase components of the transmission signal 43 in the two halves of the input coil 47. As a result, this first stage typically can improve the SNR from −25 dB at the antenna 42 to −5 dB at the output of hybrid transformer 45 (i.e., a 20 dB improvement in this particular example, although the present configuration typically can provide 20-30 dB of improvement).

In order to further improve the signal-to-noise ratio, a second stage preferably is utilized to remove nearly all of the remaining portion of transmission signal 43. For this purpose, the original transmission signal 43 (which in the current embodiment is the output of power amplifier 50, but in alternate embodiments, can mean any scaled version of it) also is coupled to the input of a wide-band phase shifter 60, which outputs a phase-shifted or delayed version of its input. As discussed in greater detail below, the resulting signal output from wide-band phase shifter 60 preferably is 180° out of phase with its input across the entire signal bandwidth. In addition, the magnitude of the output of wide-band phase shifter 60 is scaled to a level that approximates, as closely as possible, the level of the remaining portion of transmission signal 43 at the point within the receiving circuitry at which it is combined with the received signal 44. This combination effects the desired additional cancellation of transmission signal 43 within the receiving path. In the current embodiment of the invention, the cancellation in this second stage occurs in the receiver amplifier/combiner 57. As indicated, in the current embodiment, element 57 is configured to function as both an amplifier (e.g., a low-noise amplifier) and a signal combiner. However, in alternate embodiments, separate combiner and amplifier elements are used.

More specifically, in the current embodiment, the output coil 56 of transformer 45 is coupled to one input 58 of receiver amplifier/combiner 57, and the output of wide-band phase shifter 60 is coupled to another input 59 of receiver amplifier/combiner 57. Then, in receiver amplifier/combiner 57 the two signals are combined (e.g., as discussed in greater detail below), so that the output 62 of receiver amplifier/combiner 57 is almost entirely the received signal 44. Typically, this second stage can provide an additional 20-30 dB improvement in the SNR, e.g., for a total improvement (resulting from the two stages) of 40-50 dB and a final SNR of approximately 20 dB.

In the current embodiment, the output 62 of receiver amplifier/combiner 57 is coupled to mixer 63 to be frequency-shifted down to baseband and then to demodulator 64 (e.g., a rotating phase interpolator to sync the phase and frequency) in order to provide the final output received data signal 65.

Figure 2:
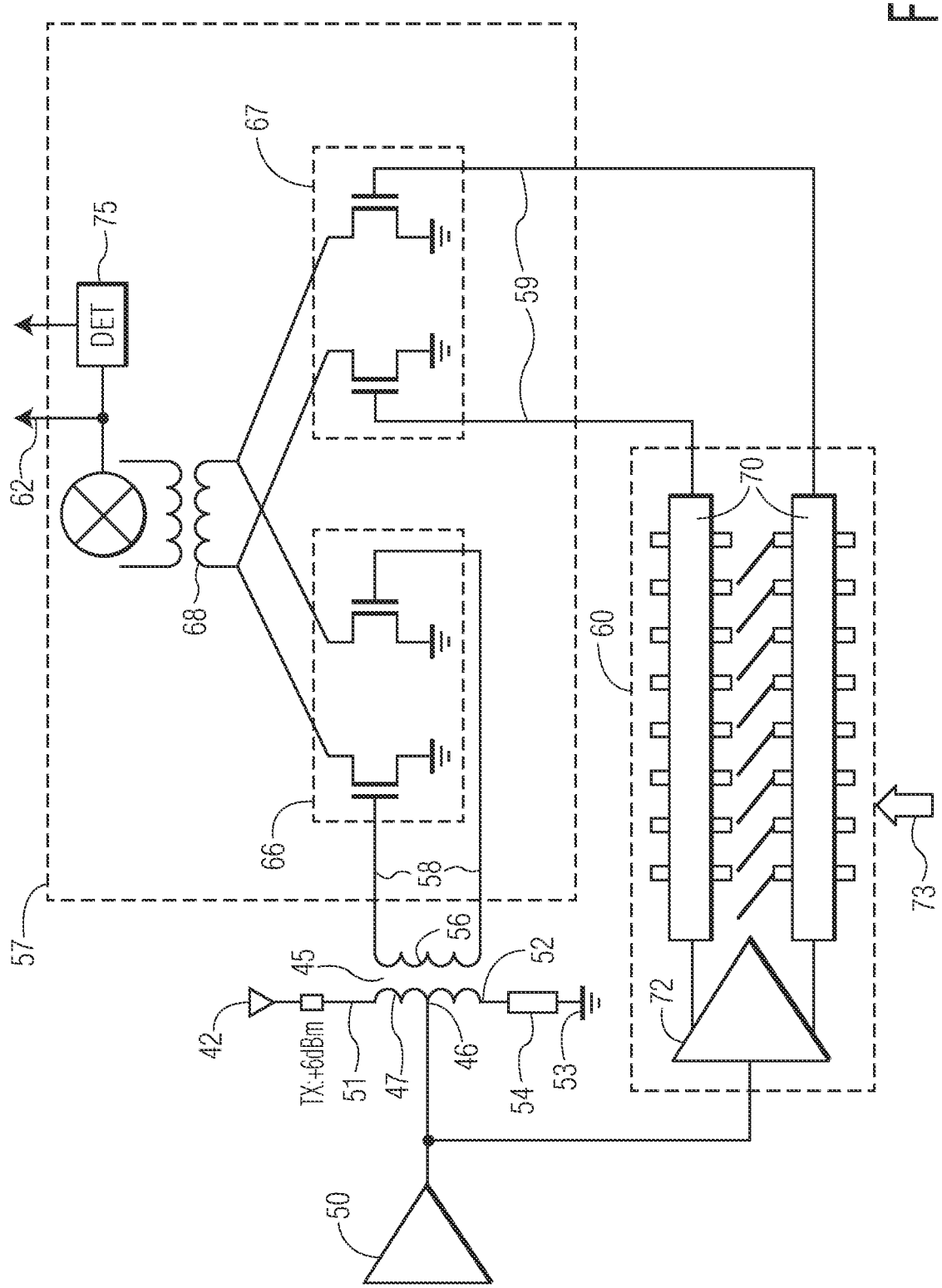
FIG. 2 is a block diagram showing additional detail of a single connector, particularly with respect to its receiver amplifier/signal-combiner and its wide-band phase shifter, according to the foregoing embodiment of the invention.

Representative implementations of receiver amplifier/combiner 57 and wide-band phase shifter 60 are shown in FIG. 2. In this embodiment, wide-band phase shifter 60 is implemented using a wide-band variable-delay line 70 (i.e., providing constant or nearly constant group delay across a wide frequency band) in combination with a variable gain element 72. In the current embodiment, variable gain element 72 is a variable attenuator and is frequently referred to as such in the following discussion. However, it should be understood that references to variable attenuator 72 can be replaced by the more general term variable gain element 72. The amount of delay introduced by wide-band variable-delay line 70 and the amount of attenuation provided by variable attenuator 72 are specified by control signals 73 which, e.g., are input from a separate digital control system (not shown in the drawings, but capable of being implemented, e.g., using a general-purpose or special-purpose processor and performing the processing discussed below in connection with FIG. 4).

In the preferred embodiments, wide-band variable-delay line 70 has the structure (or similar structure) as described in (1) A. Bautista, et al., "Accurate Parametric Electrical Model for Slow-Wave CPW and Application to Circuits Design," in IEEE Transactions on Microwave Theory and Techniques, vol. 63, no. 12, pp. 4225-4235, December 2015, doi: 10.1109/TMTT.2015.2495242; (2) T. LaRocca, et al., "Millimeter-wave CMOS digital controlled artificial dielectric differential mode transmission lines for reconfigurable ICs," 2008 IEEE MTT-S International Microwave Symposium Digest, 2008, pp. 181-184, doi: 10.1109/MWSYM.2008.4633133; or (3) any combination of the foregoing articles, which are incorporated by reference herein as though set forth herein in full.

Generally speaking, the preferred structure is configured as an artificial transmission line in which individual shunt capacitances between the two lines can be included or not by turning on or off respective in-line electronic switches (i.e., in line with the shunt capacitive elements). The result is a linear or near-linear phase shift across frequency over a wide frequency band (i.e., at least approximately constant time delay), in which the slope of such linearity (corresponding to the amount of time delay) provided by the line 70 is correspondingly being varied by switching such shunt capacitances on or off.

Figure 4:
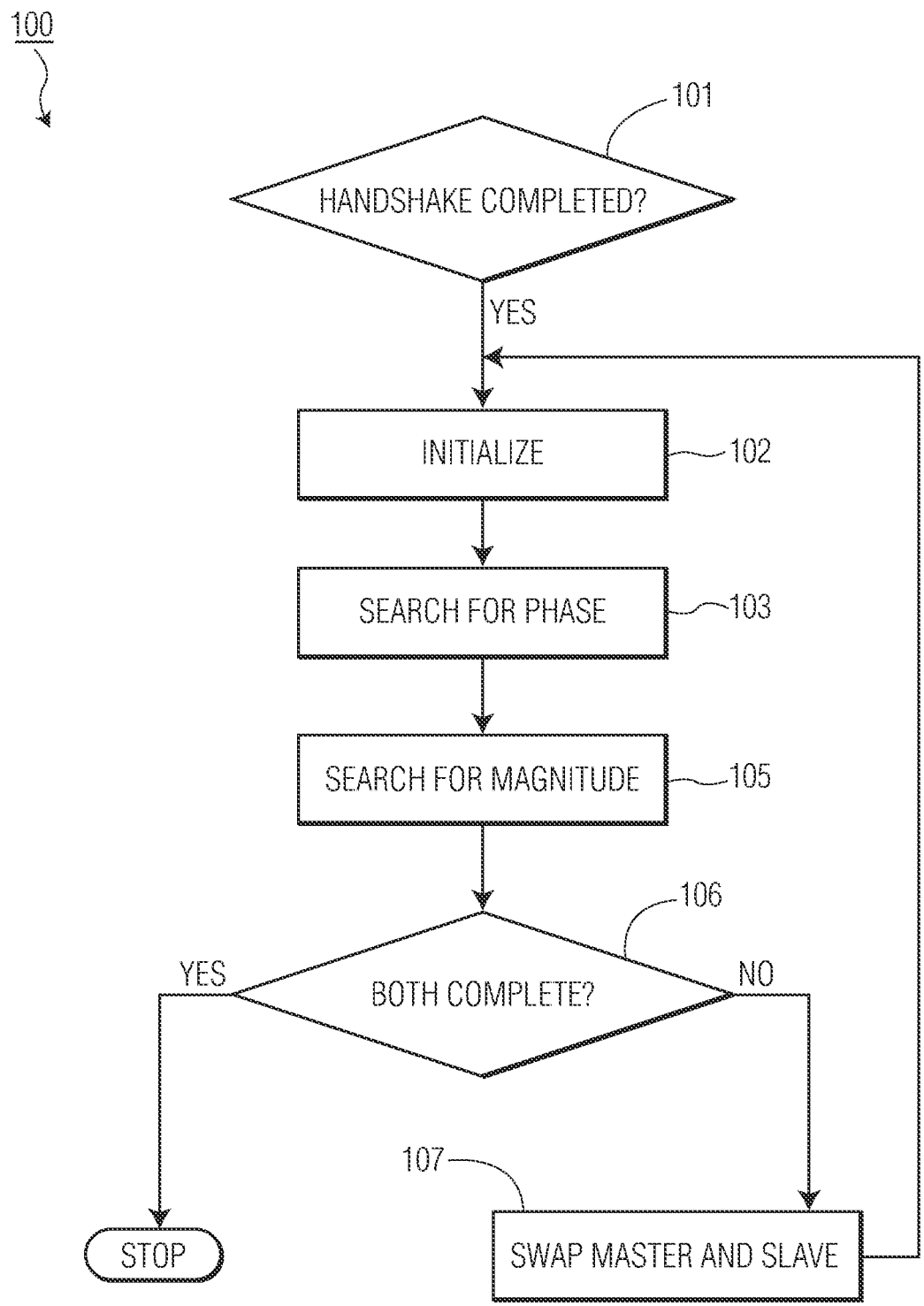
FIG. 4 is a flow diagram illustrating a process for calibrating a transmission-signal-cancellation stage for a pair of contactless connectors, e.g., prior to communicating with each other.

Preferably, the amount of such delay is fixed during ordinary use based on the results of a previously executed calibration process, e.g., as discussed below in connection with FIG. 4. In other words, in the present embodiment, across at least a very wideband, the output of wide-band phase shifter 60 essentially is identical to its input, but having a specified attenuation and a specified time delay.

As noted above, and shown in more detail in FIG. 2, output coil 56 of transformer 45 is coupled to input 58 of receiver amplifier/combiner 57, and the output of phase shifter 60 is coupled to input 59 of receiver amplifier/combiner 57. The signals at input 58 are converted into transconductances in corresponding module 66 using a pair of field-effect transistors (FETs), and similarly, the signals at input 59 are converted into transconductances in corresponding module 67 using a separate pair of FETs. Modules 66 and 67, in turn, preferably are interconnected as shown in FIG. 2 to combine the signals and push current through the primary coil of receiver amplifier/combiner 57's transformer 68. The secondary coil of transformer 68 is coupled to the output 62 of receiver amplifier/combiner 57 as well as to a signal-strength (e.g., power, in the current embodiment) detector 75.

Figure 3:
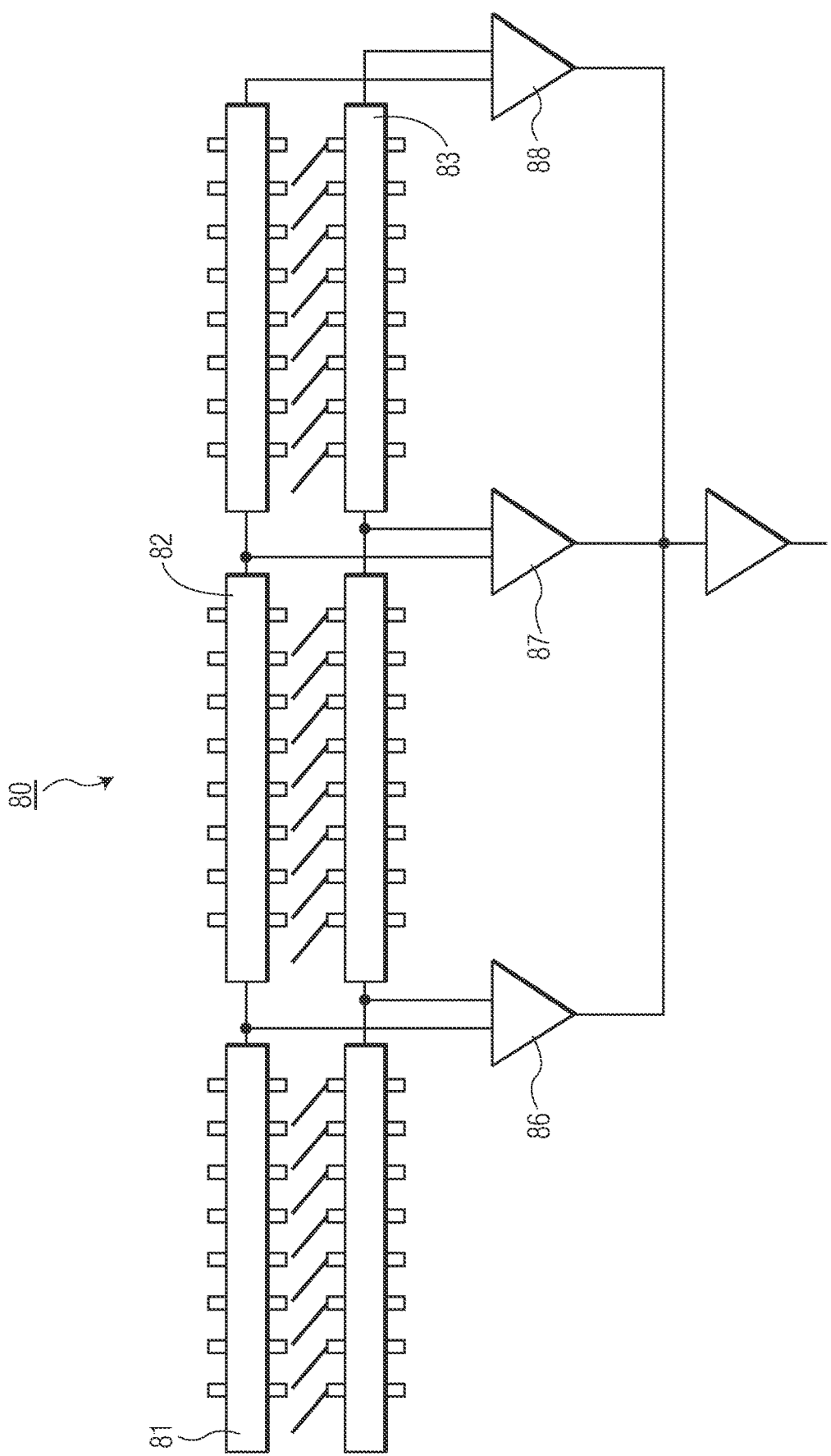
FIG. 3 is block diagram showing a wide-band variable-delay line that includes three series-connected configurable artificial transmission lines.

The foregoing discussion concerns the use of a configurable artificial transmission line for use as wide-band variable-delay line 70. In certain embodiments, e.g., in order to expand the range of possible amounts of delay that are achievable, multiple artificial transmission lines are provided and available for use. FIG. 3 illustrates one structure 80 that includes three such artificial transmission lines 81-83 and can be used as wide-band variable-delay line 70. In this configuration, the artificial transmission lines 81-83 are connected in series, and three electronic switches 86-88 are provided to control (e.g., also based on control signals 73) how many of them are actually used. In the current embodiment, only one of such electronic switches 86-88 is turned on at any given point in time, so that if only switch 86 is turned on, only artificial transmission line 81 is used; if only switch 87 is turned on, only artificial transmission lines 81 and 82 (connected in series) are used; and if only switch 88 is turned on, all three artificial transmission lines 81-83 (connected in series) are used. In any event, the output of the selected artificial transmission line(s) (in the current embodiment, series-connected if more than one) is provided to output amplifier 89.

In the current embodiment, each of the three artificial transmission lines 81-83 is configurable (so that it can provide a variable amount of delay. Accordingly, control signals 73 can select both the number of transmission line segments 81-83 to use and the amount of delay provided by each, thereby facilitating both a wider range of possible delay values and fine granularity in the overall delay provided by the resulting (in this case, composite, i.e., made up of one or more individual segments) wide-band variable-delay line 70. In alternate embodiments, different numbers of delay-line segments are made available and/or any or all of them are made configurable or non-configurable, or any combination of configurable and non-configurable segments are made available.

In order to ensure that the second self-interference cancellation stage is optimally effective, a calibration process preferably is performed prior to using connectors 10, 40. One example of such a calibration process 100 is shown in FIG. 4. Generally speaking, in process 100, the connectors 10, 40 are calibrated sequentially, beginning with one (e.g., connector 10 in the following example, although the order can be entirely arbitrary) and then proceeding to the other (e.g., connector 40 in this example). In each such calibration procedure, the connector 10, 40 that currently is being calibrated is designated as the master and the other of the two connectors 10, 40 is designated as the slave.

In the various embodiments, any of a variety of triggers can be used to begin the process 100. Preferably, however, the calibration process 100 begins when the two connectors 10, 40 are within range of each other and/or positioned appropriately relative to each other to begin communicating, but just before such communications actually start. For this purpose, in the current embodiment, the connectors 10, 40 begin broadcasting query signals and listening for responses as soon as they are turned on and initialized. Then, in step 101, once they detect each other upon completion of a pre-specified handshake protocol, process 100 begins.

In step 102, the connectors 10, 40 within pair 5 are initialized. Specifically, (1) all circuits pertaining to the slave transmitter are turned off (e.g., modulator 19 or 49 and power amplifier 20 or 50, as applicable); (2) all circuits pertaining to the master transmitter (e.g., modulator 19 or 49 and power amplifier 20 or 50, as applicable) are turned on; and (3) all circuits pertaining to at least the master receiver and, in some embodiments, the slave receiver as well (e.g., receiver amplifier/combiner 27 and/or 57, mixer 33 and/or 63, and demodulator 34 and/or 64), are turned on.

In the current embodiment, wide-band phase shifter 60 is used to control both the amplitude and the amount of phase shift to be applied to the transmission signal 43 for use in the second self-interference stage. Specifically, variable attenuator 72 controls the amplitude, and wide-band variable-delay line 70 (which may include just a single segment or multiple segments, as discussed above) controls the phase. Accordingly, in this step 102, an initial attenuation value (e.g., the maximum attenuation value or the maximum expected final attenuation value upon completion of the process 100, either predetermined or as specified by control signals 73) is set for the variable attenuator 72, and an initial phase (e.g., the minimum delay or the minimum expected final delay upon completion of the process 100, either predetermined or as specified by control signals 73) is set for the wide-band phase shifter 60 of the current master device.

Next, in step 103 a search is conducted for the optimal phase (i.e., the optimal delay in the current embodiment) to be used by the wide-band phase shifter 60 of the master device when actually communicating with the slave device. Preferably, this step involves starting with the initial phase specified in step 102, scanning across the range of possible delays while maintaining the attenuation value specified in step 102, monitoring the output of signal-strength detector 75 throughout such scanning, and identifying the phase that results in the minimum output of signal-strength detector 75 as the phase to be used (i.e., the optimal or final phase). Preferably, this value is identified as the phase at which the output of signal-strength detector 75 ceases to decline and starts to rise (e.g., after verifying that it is continuing to rise after a specified number of increases in the phase). However, in alternate embodiments, the entire range is scanned (e.g. to ensure that the phase corresponding to the absolute minimum signal strength, rather than just a local minimum, has been identified).

Next, in step 105, a search is conducted for the optimal attenuation (or gain) value (i.e., resulting in the optimal signal magnitude magnitude) to be used by the wide-band phase shifter 60 of the master device. Preferably, this step involves starting with the initial attenuation specified in step 102, scanning across the range of possible attenuation values while maintaining the phase value identified in step 103, monitoring the output of signal-strength detector 75 throughout such scanning, and identifying the attenuation value that results in the minimum output of signal-strength detector 75 as the attenuation to be used (i.e., the optimal or final attenuation value). Preferably, this value is identified as the attenuation value at which the output of signal-strength detector 75 ceases to decline and starts to rise (e.g., after verifying that it is continuing to rise after a specified number of decreases in the attenuation value). However, in alternate embodiments, the entire range is scanned (e.g. to ensure that the attenuation value corresponding to the absolute minimum signal strength, rather than just a local minimum, has been identified).

In step 106, if both connectors 10 and 40 have been calibrated, then processing is complete, and the identified (i.e., final) phase and attenuation value for each connector 10, 40 are used for that respective connector 10, 40 (when communicating signals bidirectionally with the other) until process 100 is repeated. If not, then in step 107 the master/slave roles of the two connectors 10, 40 are swapped, and the processing returns to step 102 to initialize the connectors 10, 40 for their new roles. In the current example, connector 10 would have been calibrated in the initial pass, so in this step 107, connector 10 now becomes the slave, and connector 40 now becomes the master.

Additional Considerations.

In the embodiments described above, wide-band variable-delay line 70 is used to flip the transmission signal 43 (in addition to equalizing any time delays in the circuit) so that an appropriately scaled version of it can be combined with the signal output from the transformer 45 in order to provide additional self-interference cancellation (in this second stage). In alternate embodiments, variable attenuator 42, 72 (or another component, e.g., within connector 10, 40) instead flips the transmission signal 43 (i.e., multiplies it by −1) before combining it with the received signal 44, so that wide-band variable-delay line 70 is only used to compensate for unequal time delays in the circuit.

As used herein, the term "signal" without further qualification encompasses a digital and/or analog signal and can include one or more bits or lines, e.g., having different parts for different purposes. For example, all portions of the control signals 73 used to specify the amount of delay provided by wide-band variable-delay line 70 can be considered one signal (or any or all of such different parts can be considered to be different signals or different sub-signals), and all parts used to specify the amount of gain to be applied by variable gain element 72 can be considered to be another signal.

As used herein, the term "coupled", or any other form of the word, is intended to mean either directly connected or connected through one or more other components, elements or processing blocks, e.g., for the purpose of preprocessing. In the drawings and/or the discussions of them, where individual steps, components, modules or processing blocks are shown and/or discussed as being directly connected to each other, such connections should be understood as couplings, which may include additional steps, components, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein, except to the extent expressly stated otherwise.

As used herein, the term "attached", or any other form of the word, without further modification, is intended to mean directly attached, attached through one or more other intermediate elements or components, or integrally formed together. In the drawings and/or the discussion, where two individual components or elements are shown and/or discussed as being directly attached to each other, such attachments should be understood as being merely exemplary, and in alternate embodiments the attachment instead may include additional components or elements between such two components. Similarly, method steps discussed and/or claimed herein are not intended to be exclusive; rather, intermediate steps may be performed between any two steps expressly discussed or claimed herein.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

In the preceding discussion, the terms "operators", "operations", "functions" and similar terms refer to method or process steps or to hardware components, depending upon the particular implementation/embodiment.

In the event of any conflict or inconsistency between the disclosure explicitly set forth herein or in the accompanying drawings, on the one hand, and any materials incorporated by reference herein (whether explicitly or by operation of any applicable law, regulation or rule), on the other, the present disclosure shall take precedence.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints. Similarly, the term self-interference cancellation (or other variations of that term), as used herein, is intended to mean a significant or substantial reduction in self-interference (e.g., in the amounts mentioned above) due to cancellation techniques/architectures, such as the representative techniques/architectures discussed herein, rather than absolute cancellation.

In the above discussion, certain methods are explained by breaking them down into steps listed in a particular order. Similarly, certain processing is performed by showing and/or describing modules arranged in a certain order. However, it should be noted that in each such case, except to the extent clearly indicated to the contrary or mandated by practical considerations (such as where the results from one step are necessary to perform another), the indicated order is not critical but, instead, that the described steps and/or modules can be reordered and/or two or more of such steps (or the processing within two or more of such modules) can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

As used herein, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

System Environment.

Generally speaking, except where clearly indicated otherwise, all of the systems, methods, modules, components, functionality and techniques described herein (e.g., for implementing calibration process 100, for generating the input data 48, and/or for performing further processing of the output received data signal 65) can be practiced with the use of one or more programmable general-purpose computers. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a liquid crystal display, an organic light-emitting display, a polymeric light-emitting display or any other thin-film display); (8) other output device interfaces (e.g., for connecting one or more speakers, a headphone set, a laser or other light projector and/or a printer); (9) one or more input device interfaces (e.g., for connecting a mouse, one or more physical switches or variable controls, a touchpad, tablet, touch-sensitive display or other pointing device, a keyboard, a keypad, a microphone and/or a camera or scanner); (10) a mass storage unit (such as a hard disk drive, a solid-state drive, or any other type of internal storage device); (11) a real-time clock; (12) a removable storage read/write device (such as a flash drive, a memory card, any other portable drive that utilizes semiconductor memory, a magnetic disk, a magnetic tape, an opto-magnetic disk, an optical disk, or the like); and/or (13) a modem (e.g., for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop or tablet) computers and/or smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

What is claimed is:

1. A connector circuit, comprising:
   a wireless transceiver configured to be coupled to an antenna and configured to simultaneously transmit a transmission signal and receive a received signal through the antenna,
   wherein the wireless transceiver includes a transformer, a wide-band phase shifter and a combiner,
   wherein the transformer includes a primary coil having a center tap configured to receive the transmission signal and a first end that is configured to be coupled to the antenna, and
   wherein the transmission signal also is coupled to an input of the wide-band phase shifter,
   wherein the wide-band phase shifter includes a wide-band variable-delay line that introduces a time delay specified by a first control signal;
   wherein the transformer also has a secondary coil,
   wherein an output of the secondary coil is coupled to a first input of the combiner,
   wherein an output of the wide-band phase shifter is coupled to a second input of the combiner,
   wherein an output of the combiner provides a self-interference-canceled version of the received signal;
   wherein the combiner includes a first pair of switches and a second pair of switches;
   wherein the first input of the combiner is coupled to the first pair of switches; and
   wherein the second input of the combiner is coupled to the second pair of switches.

2. The connector circuit according to claim 1:
   wherein the wide-band variable-delay line comprises
   a transmission line that includes a plurality of shunt capacitive elements, with
   an electronic switch in line with each of said capacitive elements, such that
   the first control signal specifies which of said capacitive elements are turned on and which are turned off.

3. The connector circuit according to claim 1:
   wherein the wide-band variable-delay line includes
   a plurality of variable-delay segments connected in series, as well as
   a plurality electronic switches that are configured to control, under control of the first control signal, which of said variable-delay segments are utilized by the wide-band variable-delay line at a given time.

4. The connector circuit according to claim 1:
   wherein the wide-band phase shifter also comprises
   a variable gain element having a gain that is specified by a second control signal.

5. The connector circuit according to claim 4,
   wherein the first control signal and the second control signal are set using a calibration process.

6. The connector circuit according to claim 1,
   wherein the combiner is configured as a low-noise amplifier.

7. The connector circuit according to claim 1,
   wherein the the first pair of switches is a first pair of transistors and the second pair of switches is a second pair of transistors,
   wherein the first input of the combiner is coupled to a control node of the first pair of transistors, and
   wherein the second input of the combiner is coupled to a control node of the second pair of transistors.

8. The connector circuit according to claim 7,
wherein the combiner also includes
a second transformer, and
the first and second pairs of FETs are connected so as to draw electrical current through a primary coil of the second transformer.

9. The connector circuit according to claim 7, wherein
the first pair of FETs has a transconductance that is matched to an impedance of the transformer, and
the second pair of FETs has a transconductance that is matched to an impedance of the wide-band phase shifter.

10. The connector circuit according to claim 1,
wherein the antenna in included in the connector circuit;
wherein the antenna and wireless transceiver are configured for radio-frequency wireless communications in a millimeter-wave band at combined data rates of at least 1 gigabits per second (Gbs) and over a distance of not more than 50 millimeters (mm).

11. The connector circuit according to claim 1,
wherein the transformer is a hybrid transformer.

12. The connector circuit according to claim 1,
wherein the primary coil also has a second end that is coupled to ground through a matching impedance.

13. The connector circuit according to claim 1,
wherein the output of the combiner is coupled to
a mixer for frequency-shifting the self-interference-canceled version of the received signal and
a demodulator for generating received data.

14. A method of implementing a connection, comprising:
simultaneously transmitting a transmission signal and receiving a received signal through an antenna, at combined data rates of at least 2 gigabits per second (Gbs) and over a distance of not more than 50 millimeters (mm);
removing artifacts of the transmission signal from a composite signal, using a self-interference-rejection/cancellation process that includes a first stage and a second stage, in order to obtain the received signal,
wherein the first stage uses a transformer to provide a first amount of self-interference rejection,
wherein the second stage uses a wide-band phase shifter to provide a second amount of self-interference cancellation;
wherein the wide-band phase shifter includes a wide-band variable-delay line that introduces a time delay specified by a first control signal;
a calibration process to identify an amount of delay to be provided by the wide-band variable-delay line and an amplitude of a signal output by the wide-band phase shifter;
wherein the calibration process includes,
scanning across a range of potential delays to find a delay corresponding to a minimum output signal strength, and
scanning across a range of potential gains to find a gain corresponding to a minimum output signal strength.

15. The method according to claim 14,
wherein the composite signal is input into a center tap of the transformer.

16. The method according to claim 14,
wherein the wide-band variable-delay line comprises a transmission line that includes a plurality of shunt capacitive elements that are turned on and off to control an amount of delay.

17. A connector circuit, comprising:
a wireless transceiver configured to be coupled to an antenna and configured to simultaneously transmit a transmission signal and receive a received signal through the antenna;
wherein the wireless transceiver includes a transformer, a wide-band phase shifter and a combiner;
wherein the transformer includes a primary coil having a center tap configured to receive the transmission signal and a first end that is configured to be coupled to the antenna, and
wherein the transmission signal also is coupled to an input of the wide-band phase shifter,
wherein the transformer also has a secondary coil,
wherein an output of the secondary coil is coupled to a first input of the combiner,
wherein an output of the wide-band phase shifter is coupled to a second input of the combiner, and
wherein an output of the combiner provides a self-interference-canceled version of the received signal;
wherein the combiner includes a first pair of field-effect transistors (FETs), and a second pair of FETs;
wherein the first input of the combiner is coupled to gates of the first pair of FETs, and
wherein the second input of the combiner is coupled to gates of the second pair of FETs.

* * * * *